United States Patent
Huang

(10) Patent No.: US 11,482,145 B2
(45) Date of Patent: Oct. 25, 2022

(54) CURVED DISPLAY PANEL AND METHOD FOR MANUFACTURING CURVED DISPLAY PANEL

(71) Applicant: HKC CORPORATION LIMITED, Shenzhen (CN)

(72) Inventor: Beizhou Huang, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 67 days.

(21) Appl. No.: 16/315,160

(22) PCT Filed: Mar. 6, 2018

(86) PCT No.: PCT/CN2018/078120
§ 371 (c)(1),
(2) Date: Jan. 4, 2019

(87) PCT Pub. No.: WO2019/134253
PCT Pub. Date: Jul. 11, 2019

(65) Prior Publication Data
US 2021/0358354 A1  Nov. 18, 2021

(30) Foreign Application Priority Data
Jan. 3, 2018 (CN) .......................... 201810005592.4

(51) Int. Cl.
*G09G 3/3266* (2016.01)
*G09G 3/00* (2006.01)
(Continued)

(52) U.S. Cl.
CPC ............. *G09G 3/03* (2020.08); *G02F 1/1368* (2013.01); *G02F 1/136286* (2013.01);
(Continued)

(58) Field of Classification Search
CPC ........ G09G 3/03; G09G 3/00; G09G 2380/02; G09G 3/035; G09G 3/3266; G09G 3/3674;
(Continued)

(56) References Cited

U.S. PATENT DOCUMENTS

2002/0027543 A1 3/2002 Koyama et al.
2007/0164954 A1* 7/2007 Yang .................... G09G 3/3677
345/88

(Continued)

FOREIGN PATENT DOCUMENTS

CN 1407527 A 4/2003
CN 101777301 A 7/2010
(Continued)

OTHER PUBLICATIONS

International Patent Office Official Action issued by Foreign Patent Office dated Mar. 29, 2019 for corresponding Application No. 201810005592.4.
(Continued)

*Primary Examiner* — Robert J Michaud
(74) *Attorney, Agent, or Firm* — Rosenberg, Klein & Lee

(57) ABSTRACT

A curved display panel and a method for manufacturing the same are provided. The curved display panel includes a plurality of clock buses, the clock buses extend along a first direction and are arranged along a second direction, the widths of the plurality of clock buses are different in the second direction, so that capacitance values between several clock buses and a clock signal line disconnected from the several clock buses are the same.

18 Claims, 4 Drawing Sheets

(51) Int. Cl.
  *G02F 1/1362* (2006.01)
  *G02F 1/1368* (2006.01)
  *G09G 3/36* (2006.01)
  *H01L 27/12* (2006.01)

(52) U.S. Cl.
  CPC ......... *G09G 3/3266* (2013.01); *G09G 3/3677* (2013.01); *H01L 27/124* (2013.01); *H01L 27/1259* (2013.01); *G02F 2201/56* (2013.01); *G09G 2310/0286* (2013.01); *G09G 2310/08* (2013.01)

(58) Field of Classification Search
  CPC ........ G09G 2310/0286; G09G 2310/08; G02F 1/136286
  See application file for complete search history.

(56) References Cited

U.S. PATENT DOCUMENTS

2010/0118012 A1* 5/2010 Irie ..................... G09G 3/3648
  345/211

2015/0194109 A1* 7/2015 Fujikawa ............ G02F 1/13454
  345/100
  2019/0317374 A1* 10/2019 Yamazaki ........... G02F 1/13439

FOREIGN PATENT DOCUMENTS

| | | |
  |---|---|---|
  | CN | 201984789 U | 9/2011 |
  | CN | 103745707 A | 4/2014 |
  | CN | 205375442 U | 7/2016 |
  | CN | 106991949 A | 7/2017 |
  | CN | 107978293 A | 5/2018 |
  | JP | H1184427 A | 3/1999 |
  | JP | 2016118664 A | 6/2016 |

OTHER PUBLICATIONS

International Patent Office Official Action issued by Foreign Patent Office dated Jul. 15, 2019 for corresponding Application No. 201810005592.4.

* cited by examiner

US 11,482,145 B2

CURVED DISPLAY PANEL AND METHOD FOR MANUFACTURING CURVED DISPLAY PANEL

CROSS-REFERENCE TO RELATED APPLICATIONS

This application is a U.S. national Stage of International Application No. PCT/CN2018/078120, filed on Mar. 6, 2018, designating the United States, which claims priority to Chinese Patent Application No. 201810005592.4, filed with the Chinese Patent Office on Jan. 3, 2018 and entitled "CURVED DISPLAY PANEL AND METHOD FOR MANUFACTURING CURVED DISPLAY PANEL", the content of each of which is hereby incorporated by reference in its entirety.

FIELD

Embodiments of this disclosure relate to display technologies, and for example, to a curved display panel and a method for manufacturing the same.

BACKGROUND

With the ongoing development of science and technology, various display devices such as liquid crystal televisions and liquid crystal displays are continuously spreading and are widely applied to places in which information needs to be displayed, such as homes, shopping malls, or office buildings, bringing convenience for people's production and life.

An increasing number of display panels use curved display panels. The curved display panel has a particular curvature, which can ensure that eyes of a user are equally distanced from any position on a display screen, thereby bringing better sensory experience to viewers. In addition, the curved display panel further has an advantage of occupying a smaller area compared with a plane display panel, and therefore is more welcome by users. However, because the curved display panel has a curvature, a clock signal received by a shift register is different from a clock signal transmitted on a clock bus corresponding to the shift register. This inevitably affects the display effect of the display panel.

SUMMARY

This disclosure provides a curved display panel and a method for manufacturing the same, to improve the display effect of the curved display panel.

An embodiment of this disclosure provides a curved display panel, including:

a first substrate, where the first substrate includes a display area and a non-display area surrounding the display area;

a plurality of scanning lines and a plurality of data lines, where the scanning lines and the data lines are formed in the display area of the first substrate, the scanning lines cross with the data lines to define a plurality of pixel units, the pixel unit includes an active switch and a first electrode, the active switch includes a signal input end, a signal output end, and a control end, the signal input end of the active switch is connected to the data line corresponding to the active switch, the signal output end of the active switch is connected to the first electrode, and the control end of the active switch is connected to the scanning line corresponding to the active switch;

a gate driving circuit located in the non-display area of the first substrate, where the gate driving circuit includes a plurality of shift registers, and the shift register is electrically connected to the scanning line corresponding to the shift register;

a plurality of clock buses located in the non-display area of the first substrate, where the clock buses extend along a first direction and are arranged along a second direction; and a plurality of clock signal lines located in the non-display area of the first substrate, where the clock signal lines extend along the second direction and are arranged along the first direction, and the shift register is electrically connected to the clock bus corresponding to the shift register by using the clock signal line, where the widths of the plurality of clock buses are different in the second direction, both the first direction and the second direction are parallel to a plane in which the first substrate is located, and the first direction crosses with the second direction.

Optionally, a smaller distance to a geometric center of the display panel indicates a larger width of the clock bus.

Optionally, the clock bus includes a high-frequency clock bus.

Optionally, the clock signal line is connected to the clock bus corresponding to the clock signal line through a bridge or a via.

Optionally, the first substrate includes a plurality of thin film transistors, and the thin film transistor includes a source/drain layer; and the clock bus and the source/drain layer of the thin film transistor are arranged on a same layer.

Optionally, the clock bus and the source/drain layer of the thin film transistor are made of a same material, and are formed in a same process step.

Optionally, the thin film transistor further includes a gate layer; and the clock signal line and the gate layer of the thin film transistor are arranged on a same layer.

Optionally, the clock signal line and the gate layer of the thin film transistor are made of a same material, and are formed in a same process step.

Optionally, the thin film transistor is the active switch.

Optionally, the clock bus includes a low-frequency clock bus.

Optionally, the curved display panel is a curved liquid crystal display panel, a curved organic light-emitting display panel, or a curved quantum-dot light-emitting diode display panel.

Optionally, capacitance values between a clock signal line disconnected from several clock buses and the several clock buses are the same.

An embodiment of this disclosure further provides a curved display panel, including:

a first substrate, where the first substrate includes a display area and a non-display area surrounding the display area;

a plurality of scanning lines and a plurality of data lines, where the scanning lines and the data lines are formed in the display area of the first substrate, the scanning lines cross with the data lines to define a plurality of pixel units, the pixel unit includes an active switch and a first electrode, the active switch includes a signal input end, a signal output end, and a control end, the signal input end of the active switch is connected to the data line corresponding to the active switch, the signal output end of the active switch is connected to the first electrode, and the control end of the active switch is connected to the scanning line corresponding to the active switch;

a gate driving circuit located in the non-display area of the first substrate, where the gate driving circuit includes a plurality of shift registers, and the shift register is electrically connected to the scanning line corresponding to the shift register;

a plurality of clock buses located in the non-display area of the first substrate, where the clock buses extend along a first direction and are arranged along a second direction; and a plurality of clock signal lines located in the non-display area of the first substrate, where the clock signal lines extend along the second direction and are arranged along the first direction, and the shift register is electrically connected to the clock bus corresponding to the shift register by using the clock signal line, where the widths of the plurality of clock buses are different in the second direction, the first direction and the second direction are parallel to a plane in which the first substrate is located, and the first direction crosses with the second direction;

a smaller distance to a geometric center of the display panel indicates a larger width of the clock bus; and the clock bus includes a high-frequency clock bus.

Optionally, the clock signal line is connected to the clock bus corresponding to the clock signal line through a bridge or a via.

Optionally, the first substrate includes a plurality of thin film transistors, and the thin film transistor includes a source/drain layer; and the clock bus and the source/drain layer of the thin film transistor are arranged on a same layer.

Optionally, the clock bus and the source/drain layer of the thin film transistor are made of a same material, and are formed in a same process step.

Optionally, the thin film transistor further includes a gate layer; and the clock signal line and the gate layer of the thin film transistor are arranged on a same layer.

Optionally, the clock signal line and the gate layer of the thin film transistor are made of a same material, and are formed in a same process step.

Optionally, capacitance values between a clock signal line disconnected from several clock buses and the several clock buses are the same.

Optionally, the thin film transistor is the active switch.

Optionally, the curved display panel is a curved liquid crystal display panel, a curved organic light-emitting display panel, or a curved quantum-dot light-emitting diode display panel.

An embodiment of this disclosure further provides a method for manufacturing a curved display panel, including:

providing a first substrate, where the first substrate includes a display area and a non-display area surrounding the display area;

forming a plurality of scanning lines and a plurality of data lines in the display area of the first substrate, where the scanning lines cross with the data lines to define a plurality of pixel units, the pixel unit includes an active switch and a first electrode, the active switch includes a signal input end, a signal output end, and a control end, the signal input end of the active switch is connected to the data line corresponding to the active switch, the signal output end of the active switch is connected to the first electrode, and the control end of the active switch is connected to the scanning line corresponding to the active switch;

forming a gate driving circuit in the non-display area of the first substrate, where the gate driving circuit includes a plurality of shift registers, and the shift register is connected to the scanning line corresponding to the shift register;

forming a plurality of clock buses in the non-display area of the first substrate, where the clock buses extend along a first direction and are arranged along a second direction; and forming a plurality of clock signal lines in the non-display area of the first substrate, where the clock signal lines extend along the second direction and are arranged along the first direction, and the shift register is electrically connected to the clock bus corresponding to the shift register by using the clock signal line, where the widths of the plurality of clock buses are different in the second direction, the first direction and the second direction are parallel to a plane in which the first substrate is located, and the first direction crosses with the second direction.

According to the technical solutions provided in the embodiments of this disclosure, the widths of the plurality of clock buses are set to be different in the second direction, so that the capacitance values between the several clock buses and the clock signal line disconnected from the several clock buses are the same. This resolves a problem that the display effect of the curved display panel is affected because different distances between clock buses and a clock signal line that are disconnected from each other and that are located on different film layers on the curved display panel cause different coupling capacitance values between the clock buses and the clock signal line that are disconnected from each other and that are located on the different film layers, and further cause a difference between a clock signal received by the shift register and a clock signal transmitted on the clock bus corresponding to the shift register, thereby improving the display effect of the curved display panel.

The above and other features of the disclosure including various novel details of construction and combinations of parts, and other advantages, will now be more particularly described with reference to the accompanying drawings and pointed out in the claims.

DETAILED DESCRIPTION OF THE INVENTION

This disclosure is described below with reference to the accompanying drawings and the embodiments. It can be understood that the embodiments described herein are used only to explain this disclosure rather than limit this disclosure. In addition, it should further be noted that for convenience of description, only some rather than all content related to this disclosure is shown in the accompanying drawings.

Because a curved display panel has a curvature, distances between clock buses and a clock signal line that are disconnected from each other and that are located on different film layers of the curved display panel are different. Therefore, coupling capacitance values between the clock buses and the clock signal line that are disconnected from each other and that are located on the different film layers are different. Further, a clock signal received by a shift register is different from a clock signal transmitted on the clock bus corresponding to the shift register. This affects the display effect of the display panel.

Figure 1:
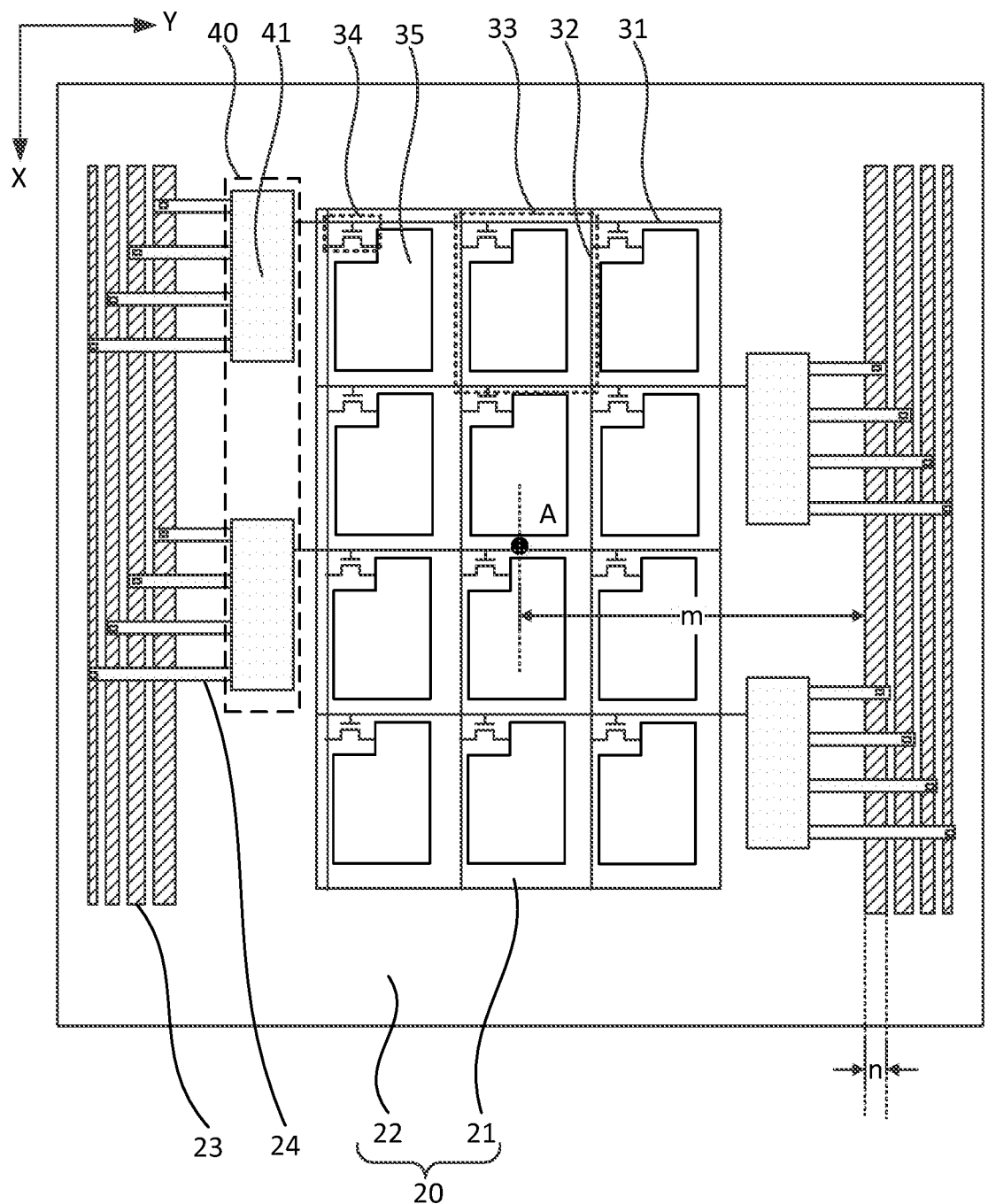
FIG. 1 is a schematic structural diagram of a display panel according to an embodiment of this disclosure.

FIG. 1 is a schematic structural diagram of a display panel according to an embodiment of this disclosure. Referring to FIG. 1, the display panel includes: a first substrate 20, where the first substrate 20 includes a display area 21 and a non-display area 22 surrounding the display area 21; at least one scanning line 31 (for example, only four scanning lines 31 are included in FIG. 1) and at least one data line 32 (for example, only three data lines 32 are included in FIG. 1), where the scanning line 31 and the data line 32 are formed in the display area 21 of the first substrate 20, the scanning line 31 crosses with the data line 32 to define a plurality of pixel units 33, the pixel unit 33 includes an active switch 34 and a first electrode 35, the active switch 34 includes a signal input end, a signal output end, and a control end, the signal input end of the active switch 34 is connected to the data line 32 corresponding to the active switch 34, the signal output end of the active switch 34 is connected to the first electrode 35, and the control end of the active switch 34 is connected to the scanning line 31 corresponding to the active switch 34; a gate driving circuit 40 located in the non-display area 22 of the first substrate 20, where the gate driving circuit 40 includes a plurality of shift registers 41 (for example, only four shift registers 41 are included in FIG. 1), and the shift register 41 is electrically connected to the scanning line 31 corresponding to the shift register 41;

a plurality of clock buses 23 located in the non-display area 22 of the first substrate 20, where the clock buses 23 extend along a first direction (that is, the X-axis direction in FIG. 1) and are arranged along a second direction (that is, the Y-axis direction in FIG. 1); and a plurality of clock signal lines 24 located in the non-display area 22 of the first substrate 20, where the clock signal lines 24 extend along the second direction (that is, the Y-axis direction in FIG. 1) and are arranged along the first direction (that is, the X-axis direction in FIG. 1), and the shift register 41 is electrically connected to the clock bus 23 corresponding to the shift register 41 by using the clock signal line 24. The widths n of the plurality of clock buses 23 are different in the second direction (that is, the Y-axis direction in FIG. 1), both the first direction (that is, the X-axis direction in FIG. 1) and the second direction (that is, the Y-axis direction in FIG. 1) are parallel to a plane in which the first substrate 20 is located, and the first direction (that is, the X-axis direction in FIG. 1) crosses with the second direction (that is, the Y-axis direction in FIG. 1).

The curved display panel has different curvatures at different positions, causing different distances between the clock buses 23 and the clock signal line 24 that are disconnected from each other and that are located at different positions. Herein, the distance between the clock bus 23 and the clock signal line 24 refers in particular to a distance between the clock bus 23 in a direction perpendicular to the display panel and the clock signal line 24.

According to the formula $$C = \frac{\varepsilon S}{4\pi k d},$$

where ε is a dielectric constant, S is an area of overlap of the clock bus 23 and the clock signal line 24, k is an electrostatic constant, and d is the distance between the clock bus 23 and the clock signal line 24, it can be learned from the foregoing formula that a capacitance value C between the clock bus 23 and the clock signal line 24 is related to the area S of overlap of the clock bus 23 and the clock signal line 24. According to the foregoing technical solution, the widths n of the plurality of clock buses 23 are set to be different in the second direction, where the essence is that the area S of overlap of the clock bus 23 and the clock signal line 24 is adjusted according to a curvature at a different position on the display panel, so that capacitance values between several clock buses 23 and the clock signal line 24 on the curved display panel that are disconnected from the several clock buses 23 are the same, and further, a clock signal received by each shift register 41 in the gate driving circuit 40 on the display panel is facilitated to be consistent with a clock signal transmitted on the clock bus 23 corresponding the shift register 41, thereby improving the display effect of the curved display panel.

On the curved display panel, when the widths of the clock buses 23 are consistent, a smaller distance m between a clock bus 23 and the geometric center A of the curved liquid crystal display panel leads to larger capacitance between the clock bus 23 and a clock signal line 24 disconnected from the clock bus 23. Considering this, as shown in FIG. 1, it may be set that the smaller distance m to the geometric center A of the curved display panel leads to a larger width n of the clock bus 23. It can be learned from the formula $$C = \frac{\varepsilon S}{4\pi k d}$$

that, that capacitance values between several clock buses 23 and the clock signal line 24 disconnected from the several clock buses 23 are the same can be ensured by setting that the smaller distance m to the geometric center A of the curved display panel leads to the larger width n of the clock bus 23.

It should be noted that in FIG. 1, four clock buses 23 are arranged on each of two opposite sides of the non-display area 22 of the first substrate 20. This is merely an example provided in this disclosure and is not intended to limit this disclosure. During arrangement, the clock bus 23 may be arranged at any position in the non-display area 22 of the first substrate 20 and the number of clock buses 23 may be determined according to an actual requirement.

Figure 2:
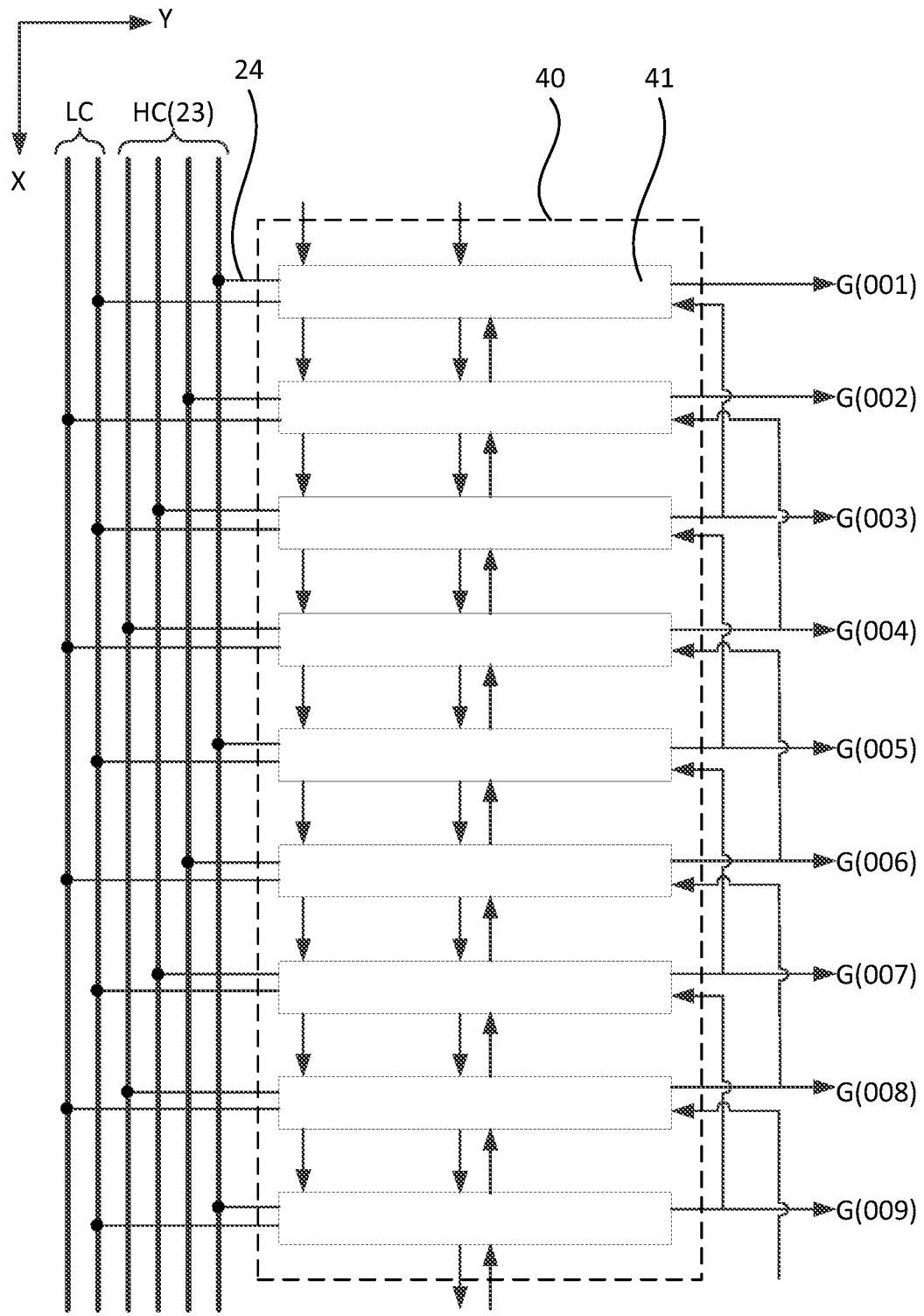
FIG. 2 is a schematic diagram of a connection relationship between a clock bus and a gate driving circuit on a display panel according to an embodiment of this disclosure.

FIG. 2 is a schematic diagram of a connection relationship between a clock bus and a gate driving circuit on a display panel according to an embodiment of this disclosure. Referring to FIG. 2, for example, the gate driving circuit 40 includes nine stages of shift registers 41. Each stage of shift register 41 includes two clock signal input ports, and the two clock signal input ports are electrically connected to a high-frequency clock bus (HC) and a low-frequency clock bus (LC) respectively. In this way, each stage of shift register 41 in the gate driving circuit 40 can generate a gate scanning signal according to a clock signal from the high-frequency clock bus (HC) and the like, and output the gate scanning signal to each scanning line 31 in the display area 21 of the first substrate 20 in sequence. Further, a data signal can be transmitted to each first electrode 35 in the display area 21 of the first substrate 20 by using the data line 32 in the display area 21 of the first substrate 20. For example, the first stage of shift register 41 can generate a gate scanning signal G(001) according to a clock signal from a high-frequency clock bus (HC) and the like, and transmit the gate scanning signal to the first scanning line 31 in the display area 21 of the first substrate 20, the second stage of shift register 41 can generate a gate scanning signal G(002) according to a clock signal from a high-frequency clock bus (HC) and the like, and transmit the gate scanning signal to the second scanning line 31 in the display area 21 of the first substrate 20, and so on.

During actual setting, optionally, the widths of the high-frequency clock bus (HC) and/or the low-frequency clock bus (LC) are set to be different in the second direction (that is, the Y-axis direction), so that capacitance values between several clock buses 23 and the clock signal line 24 disconnected from the several clock buses 23 are the same.

In still another embodiment, in an actual use process, considering that the clock signal on the high-frequency clock bus (HC) directly affects a gate scanning signal generated by the shift register 41, and the low-frequency clock bus (LC) has a function of removing noise and slightly affects the gate scanning signal, it may be set that the widths of high-frequency clock buses (HC) 23 are different in the second direction, so that capacitance values between several high-frequency clock buses (HC) 23 and a clock signal line 24 disconnected from the several high-frequency clock buses (HC) 23 are the same. The widths of the high-frequency clock buses (HC) 23 are set to be different in the second direction, so that the non-display area of the display panel can be reduced while ensuring that the display panel has a better display effect.

Figure 3:
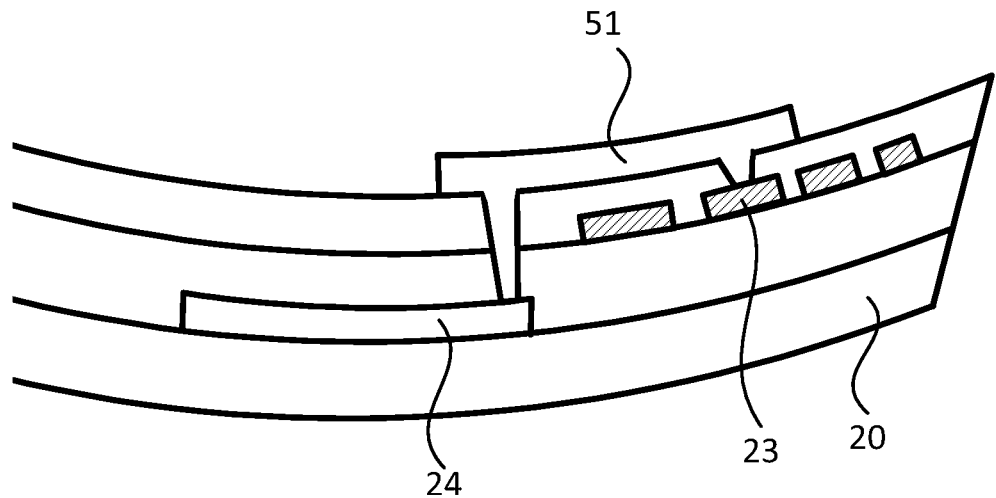
FIG. 3 is a schematic structural diagram of a partial cross section of a display panel according to an embodiment of this disclosure.
Figure 4:
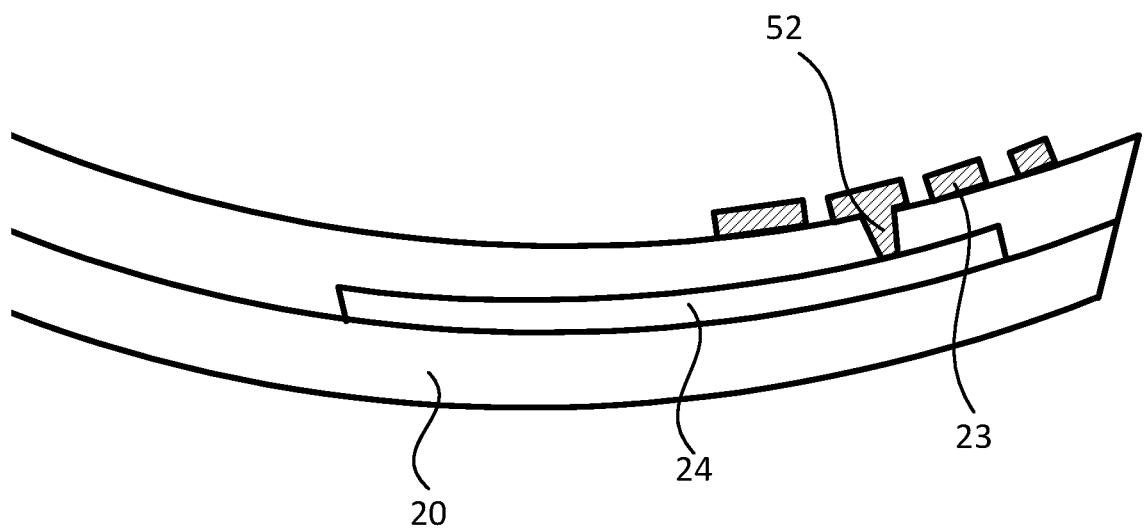
FIG. 4 is a schematic structural diagram of a partial cross section of another display panel according to an embodiment of this disclosure.

In still another optional embodiment, referring to FIG. 3, the clock signal line 24 is connected to the clock bus 23 corresponding to the clock signal line 24 by using a bridge 51. Alternatively, referring to FIG. 4, the clock signal line 24 is connected to the clock bus 23 corresponding to the clock signal line 24 by using a via 52.

Figure 5:
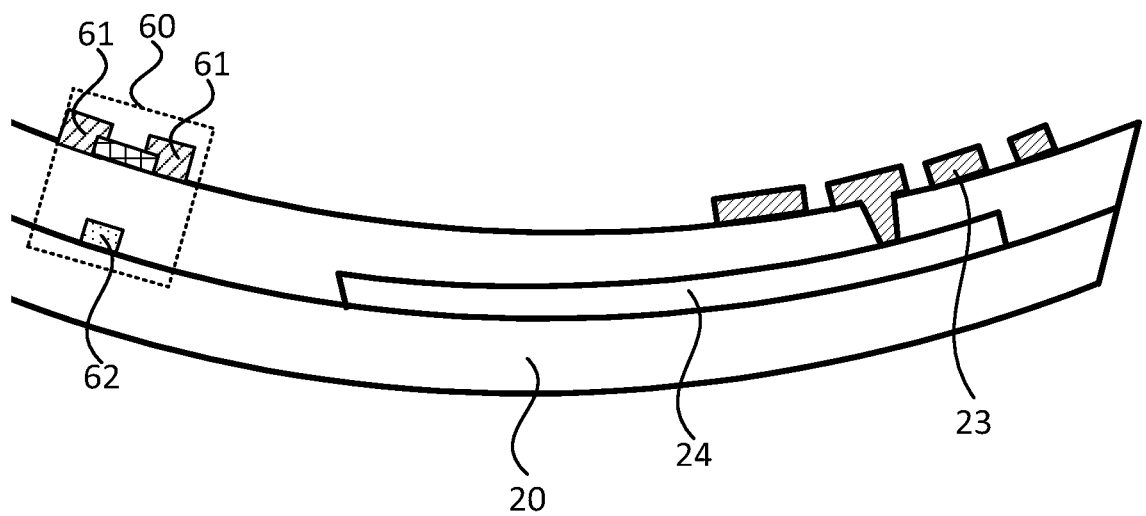
FIG. 5 is a schematic structural diagram of a partial cross section of still another display panel according to an embodiment of this disclosure.

FIG. 5 is a partial schematic structural diagram of still another display panel according to an embodiment of this disclosure. Referring to FIG. 5, the first substrate 20 may include a plurality of thin film transistors 60. The thin film transistor 60 includes a source/drain layer 61. The clock bus 23 and the source/drain layer 61 of the thin film transistor 60 are arranged on a same layer. That is, the clock bus 23 and the source/drain layer 61 of the thin film transistor 60 are located on a same film layer, to reduce the thickness of the curved display panel. During manufacturing, it may be set that the clock bus 23 and the source/drain layer 61 of the thin film transistor 60 are made of a same material, and are formed in a same process step. Therefore, in an actual manufacturing process, an etching process needs to be performed only once, and there is no need to manufacture a mask for the clock bus 23 and the source/drain layer 61 of the thin film transistor 60 separately, thereby reducing production costs, reducing the number of processes, and improving the production efficiency.

Similarly, the thin film transistor 60 further includes a gate layer 62, and the clock signal line 24 and the gate layer 62 of the thin film transistor 60 may be arranged on a same layer. That is, it may be set that the clock signal line 24 and the gate layer 62 of the thin film transistor 60 are located on a same film layer, to reduce the thickness of the curved display panel. During manufacturing, it may be set that the clock signal line 24 and the gate layer 62 of the thin film transistor 60 are made of a same material, and are formed in a same process step. Therefore, in an actual manufacturing process, an etching process needs to be performed only once, and there is no need to manufacture a mask for the clock signal line 24 and the gate layer 62 of the thin film transistor 60 separately, thereby reducing production costs, reducing the number of processes, and improving the production efficiency.

It should be noted that the thin film transistor 60 may be an active switch formed in the display area 21 of the first substrate 20 and configured to control a working status of the pixel unit, or may be a thin film transistor formed in the shift register in the non-display area 22 of the first substrate 20 and configured to generate a scanning signal, or may be a thin film transistor for another purpose. This is not limited in this embodiment of this disclosure.

In the foregoing embodiment, the display panel may be any type of display panel, for example, a liquid crystal display (LCD) panel, an organic light-emitting diode (OLED) display panel, or a quantum dot light-emitting diode (QLED) display panel.

The display panel may be applied to a mobile phone, a notebook computer, a smart television, a smart wearable device, an information inquiring machine in a public hall, and the like.

Figure 6:
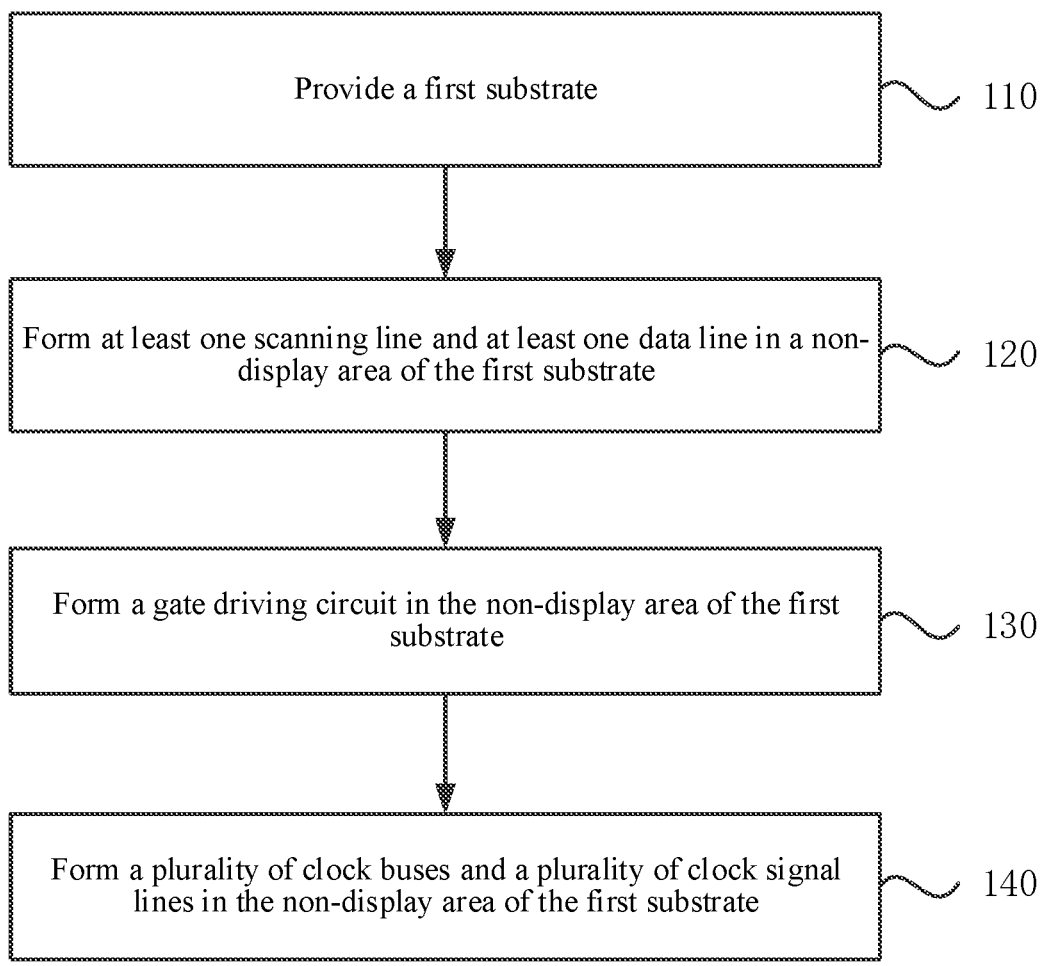
FIG. 6 is a flowchart of a method for manufacturing a display panel according to an embodiment of this disclosure.

Based on a same inventive concept, an embodiment of this disclosure further provides a method for manufacturing a display panel. FIG. 6 is a flowchart of the method for manufacturing a display panel according to this embodiment of this disclosure. Referring to FIG. 6, the method for manufacturing a display panel includes:

Step 110. Provide a first substrate 20.

The first substrate 20 includes a display area 21 and a non-display area 22 surrounding the display area 21.

Step 120. Form at least one scanning line 31 and at least one data line 32 in a non-display area 22 of the first substrate 20.

The scanning line 31 crosses with the data line 32 to define a plurality of pixel units 33. The pixel unit 33 includes an active switch 34 and a first electrode 35, and the active switch 34 includes a signal input end, a signal output end, and a control end. The signal input end of the active switch 34 is connected to the data line 32 corresponding to the active switch 34, the signal output end of the active switch 34 is connected to the first electrode 35, and the control end of the active switch 34 is connected to the scanning line 31 corresponding to the active switch 34.

Step 130. Form a gate driving circuit 40 in the non-display area 22 of the first substrate 20.

The gate driving circuit 40 includes a plurality of shift registers 41, and the shift register 41 is electrically connected to the scanning line 31 corresponding to the shift register 41.

Step 140. Form a plurality of clock buses 23 and a plurality of clock signal lines 24 in the non-display area 22 of the first substrate 20.

The clock buses 23 extend along a first direction and are arranged along a second direction. The clock signal lines 24 extend along the second direction and are arranged along the first direction. The shift register 41 is electrically connected to the clock bus 23 corresponding to the shift register 41 by using the clock signal line 24.

The widths n of the plurality of clock buses 23 are different in the second direction. The first direction and the second direction are parallel to a plane in which the first substrate 20 is located, and the first direction crosses with the second direction.

According to the method for manufacturing a display panel provided in this embodiment of this disclosure, the widths n of the plurality of clock buses 23 are set to be different in the second direction, so that capacitance values between several clock buses 23 and a clock signal line 24 disconnected from the several clock buses 23 are the same. This resolves a problem that the display effect of the curved display panel is affected because different distances between clock buses 23 and a clock signal line 34 that are disconnected from each other and that are located on different film layers on the display panel cause different coupling capacitance values between the clock buses 23 and the clock signal line 24 that are disconnected from each other and that are located on the different film layers, and further cause a difference between a clock signal received by the shift register and a clock signal transmitted on the clock bus 24 corresponding to the shift register, thereby improving the display effect of the display panel.

Although the description is illustrated and described herein with reference to certain embodiments, the description is not intended to be limited to the details shown. Modifications may be made in the details within the scope and range equivalents of the claims.

The invention claimed is:

1. A curved display panel, comprising:
   a first substrate, wherein the first substrate comprises a display area and a non-display area surrounding the display area;
   a plurality of scanning lines and a plurality of data lines, wherein the scanning lines and the data lines are formed in the display area of the first substrate, the scanning lines cross with the data lines to define a plurality of pixel units, wherein each pixel unit comprises an active switch and a first electrode, the active switch comprises a signal input end, a signal output end, and a control end, the signal input end of the active switch is connected to the data line corresponding to the active switch, the signal output end of the active switch is connected to the first electrode, and the control end of the active switch is connected to the scanning line corresponding to the active switch;
   a gate driving circuit located in the non-display area of the first substrate, wherein the gate driving circuit comprises a plurality of shift registers, and the shift register is electrically connected to the scanning line corresponding to the shift register;
   a plurality of clock buses located in the non-display area of the first substrate, wherein the clock buses extend along a first direction and are arranged along a second direction; and
   a plurality of clock signal lines located in the non-display area of the first substrate, wherein each clock signal line extends along the second direction and are arranged along the first direction, and the shift register is electrically connected to the clock bus corresponding to the shift register by using the clock signal line, wherein
   the widths of the plurality of clock buses are different in the second direction, so that capacitance values between the plurality of clock buses and the clock signal lines that are disconnected from the plurality of clock buses on the curved display panel are the same, both the first direction and the second direction are parallel to a plane in which the first substrate is located, and the first direction crosses with the second direction.

2. The curved display panel according to claim 1, wherein a smaller distance to a geometric center of the display panel indicates a larger width of the clock bus.

3. The curved display panel according to claim 1, wherein the clock bus comprises a high-frequency clock bus.

4. The curved display panel according to claim 1, wherein the clock signal line is connected to the clock bus corresponding to the clock signal line through a bridge or a via.

5. The curved display panel according to claim 1, wherein
   the first substrate comprises a plurality of thin film transistors, and the thin film transistor comprises a source/drain layer; and
   the clock bus and the source/drain layer of the thin film transistor are arranged on a same layer.

6. The curved display panel according to claim 5, wherein the clock bus and the source/drain layer of the thin film transistor are made of a same material, and are formed in a same process step.

7. The curved display panel according to claim 5, wherein
   the thin film transistor further comprises a gate layer; and
   the clock signal line and the gate layer of the thin film transistor are arranged on a same layer.

8. The curved display panel according to claim 7, wherein the clock signal line and the gate layer of the thin film transistor are made of a same material, and are formed in a same process step.

9. The curved display panel according to claim 5, wherein the thin film transistor is the active switch.

10. The curved display panel according to claim 1, wherein the curved display panel is a curved liquid crystal display panel, a curved organic light-emitting diode display panel, or a curved quantum-dot light-emitting diode display panel.

11. A curved display panel, comprising:
    a first substrate, wherein the first substrate comprises a display area and a non-display area surrounding the display area;
    a plurality of scanning lines and a plurality of data lines, wherein the plurality of scanning lines and the data lines are formed in the display area of the first substrate, the plurality of scanning lines cross with the data lines to define a plurality of pixel units, wherein each pixel unit comprises an active switch and a first electrode, the active switch comprises a signal input end, a signal output end, and a control end, the signal input end of the active switch is connected to the data line corresponding to the active switch, the signal output end of the active switch is connected to the first electrode, and the control end of the active switch is connected to the scanning line corresponding to the active switch;
    a gate driving circuit located in the non-display area of the first substrate, wherein the gate driving circuit comprises a plurality of shift registers, and wherein each shift register is electrically connected to the scanning line corresponding to the shift register;
    a plurality of clock buses located in the non-display area of the first substrate, wherein the clock buses extend along a first direction and are arranged along a second direction; and
    a plurality of clock signal lines located in the non-display area of the first substrate, wherein the clock signal lines extend along the second direction and are arranged along the first direction, and the shift register is electrically connected to the clock bus corresponding to the shift register by using a clock signal line of the plurality of clock signal lines, wherein the widths of the plurality of clock buses are different in the second direction, so that capacitance values between the plurality of clock buses and the clock signal lines that are disconnected from the plurality of clock buses on the curved display panel are the same, the first direction and the second direction are parallel to a plane in which the first substrate is located, and the first direction crosses with the second direction;

a smaller distance to a geometric center of the display panel indicates a larger width of the clock bus; and the clock bus comprises a high-frequency clock bus.

12. The curved display panel according to claim 11, wherein the clock signal line is connected to the clock bus corresponding to the clock signal line through a bridge or a via.

13. The curved display panel according to claim 11, wherein the first substrate comprises a plurality of thin film transistors, and the thin film transistor comprises a source/drain layer; and the clock bus and the source/drain layer of the thin film transistor are arranged on a same layer.

14. The curved display panel according to claim 13, wherein the clock bus and the source/drain layer of the thin film transistor are made of a same material, and are formed in a same process step.

15. The curved display panel according to claim 13, wherein the thin film transistor further comprises a gate layer; and the clock signal line and the gate layer of the thin film transistor are arranged on a same layer.

16. The curved display panel according to claim 15, wherein the clock signal line and the gate layer of the thin film transistor are made of a same material, and are formed in a same process step.

17. The curved display panel according to claim 11, wherein the curved display panel is a curved liquid crystal display panel, a curved organic light-emitting display panel, or a curved quantum-dot light-emitting diode display panel.

18. A method for manufacturing a curved display panel, comprising:

providing a first substrate, wherein the first substrate comprises a display area and a non-display area surrounding the display area;

forming a plurality of scanning lines and a plurality of data lines in the display area of the first substrate, wherein the plurality of scanning lines cross with the plurality of data lines to define a plurality of pixel units, wherein each pixel unit comprises an active switch and a first electrode, the active switch comprises a signal input end, a signal output end, and a control end, the signal input end of the active switch is connected to the data line corresponding to the active switch, the signal output end of the active switch is connected to the first electrode, and the control end of the active switch is connected to the scanning line corresponding to the active switch;

forming a gate driving circuit in the non-display area of the first substrate, wherein the gate driving circuit comprises a plurality of shift registers, and the shift register is connected to the scanning line corresponding to the shift register;

forming a plurality of clock buses in the non-display area of the first substrate, wherein the clock buses extend along a first direction and are arranged along a second direction; and forming a plurality of clock signal lines in the non-display area of the first substrate, wherein the clock signal lines extend along the second direction and are arranged along the first direction, and the shift register is electrically connected to the clock bus corresponding to the shift register by using a clock signal line of the plurality of clock signal lines, wherein the widths of the plurality of clock buses are different in the second direction, so that capacitance values between the plurality of clock buses and the clock signal lines that are disconnected from the plurality of clock buses on the curved display panel are the same, the first direction and the second direction are parallel to a plane in which the first substrate is located, and the first direction crosses with the second direction.

* * * * *